(12) United States Patent
Geng et al.

(10) Patent No.: US 12,068,893 B2
(45) Date of Patent: Aug. 20, 2024

(54) TWO-DIMENSIONAL HIGH-SPEED EQUALIZER WITH PROGRAMMABLE DIRECT CURRENT (DC) AND PEAKING GAINS

(71) Applicant: NXP USA, Inc., Austin, TX (US)

(72) Inventors: Xueyang Geng, Chandler, AZ (US); Xu Zhang, Chandler, AZ (US); Xiaoqun Liu, Chandler, AZ (US); Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 47 days.

(21) Appl. No.: 18/069,664

(22) Filed: Dec. 21, 2022

(65) Prior Publication Data

US 2024/0223411 A1    Jul. 4, 2024

(51) Int. Cl.
*H04L 25/03*   (2006.01)
*H03F 3/45*    (2006.01)
*H03K 17/60*   (2006.01)
*H03K 17/687*  (2006.01)

(52) U.S. Cl.
CPC ... *H04L 25/03878* (2013.01); *H03F 3/45076* (2013.01); *H03K 17/60* (2013.01); *H03K 17/687* (2013.01); *H03F 2203/45458* (2013.01); *H03F 2203/45496* (2013.01)

(58) Field of Classification Search
CPC ........... H04L 25/03878; H03F 3/45076; H03F 2203/45458; H03F 2203/45496; H03K 17/60; H03K 17/687
See application file for complete search history.

(56) References Cited

U.S. PATENT DOCUMENTS

| 10,447,507 | B1 * | 10/2019 | Zhang | H03G 5/28 |
| 10,924,307 | B1 | 2/2021 | Zhang et al. | |
| 11,206,160 | B2 | 12/2021 | Delshadpour et al. | |
| 11,228,470 | B2 | 1/2022 | Delshadpour et al. | |
| 11,296,667 | B1 | 4/2022 | Delshadpour | |
| 11,296,737 | B1 | 4/2022 | Delshadpour | |
| 2016/0254932 | A1 * | 9/2016 | Chong | H04L 25/0288 |
| | | | | 375/233 |

OTHER PUBLICATIONS

Liu, Tong et al. "A 40Gb/s Linear Redriver with Multi-Band Equalization in 130nm SiGe BiCMOS", (2021), 5 pgs.
(Continued)

*Primary Examiner* — Sung S Ahn

(57) ABSTRACT

Embodiments of equalizers are disclosed. In an embodiment, an equalizer includes a first signal path segment that includes a first plurality of serially connected transistors and current sources, a second signal path segment that includes a second plurality of serially connected transistors and current sources, and at least one termination resistor connected to the first and second signal path segments. The first plurality of serially connected transistors and current sources includes a first current source and a second current source connectable to a reference voltage and a first transistor and a second transistor connected between input terminals of the equalizer and the first and second current sources, where the first signal path segment further includes at least one resistor connected between the first and second current sources.

20 Claims, 4 Drawing Sheets

(56) References Cited

OTHER PUBLICATIONS

Pan, Quan et al. "A 30-GB/s 1.37-pJ/b CMOS Receiver for Optical Interconnects", Journal of Lightwave Technology, vol. 33, No. 4, Feb. 15, 2015, pp. 778-786.
Delshadpour, Siamak et al. "A 20.6 Gb/s Programmable Peaking Gain CTLE", IEEE (2020), pp. 762-765.
Balteanu, Andreea et al., "A cable equalizer with 31 dB of adjustable peaking at 52 GHz", IEEE Bipolar/BiCMOS Circuits and Technology Meeting, (2009), p. 154-157.
Zhang, G.E et al. "A 10 GB/s BiCMOS Adaptive Cable Equalizer", IEEE Journal of Solid-State Circuits, vol. 40, No. 11, (2005), p. 2132 - 2140.
Liu, H. et al. "An HDMI Cable Equalizer With Self-Generated Energy Ratio Adaptation Scheme", IEEE Transactions on Circuits and Systems—II: Express Briefs, vol. 56, No. 7, (2009), pp. 595-599.
Delshadpour, Siamak et al. "A 5.4 Gbps Protocol Based CMOS Limiting ReDriver for Type-C Applications", IEEE (2019), pp. 255-258.

\* cited by examiner

TWO-DIMENSIONAL HIGH-SPEED EQUALIZER WITH PROGRAMMABLE DIRECT CURRENT (DC) AND PEAKING GAINS

BACKGROUND

Communication systems, for example, wide band communication systems such as universal serial bus (USB), high-definition multimedia interface (HDMI), DisplayPort (DP), Peripheral Component Interconnect Express (PCIe), Thunderbolt, Converged Input Output (CIO, also known as USB4) often include stages of processing within their electronic circuitry. A communication system may include several stages including modules to equalize, amplify and/or re-drive signals for its data channels. For example, an equalizer (e.g., a Continuous Time Linear Equalizer (CTLE)) can be deployed at a receiver (RX) front end to compensate the channel loss and to provide an equalized low-jitter output data. Because longer wire/cable or connecting paths on a printed circuit board (PCB) can lead to more insertion loss at certain frequencies, an equalizer needs to provide a higher compensation or gain for the higher insertion loss and provide a fairly flat gain in the frequency bandwidth of interest. However, designing an equalizer with programmable gains can be challenging for high-frequency applications because of noise and/or power consumption consideration.

SUMMARY

Embodiments of equalizers are disclosed. In an embodiment, an equalizer includes a first signal path segment that includes a first plurality of serially connected transistors and current sources, a second signal path segment that includes a second plurality of serially connected transistors and current sources, and at least one termination resistor connected to the first and second signal path segments. The first plurality of serially connected transistors and current sources includes a first current source and a second current source connectable to a reference voltage and a first transistor and a second transistor connected between input terminals of the equalizer and the first and second current sources, where the first signal path segment further includes at least one resistor connected between the first and second current sources. Other embodiments are also described.

In an embodiment, at least one of the first and second signal path segments includes a bipolar junction transistor (BJT) or a metal-oxide-semiconductor field-effect transistor (MOSFET).

In an embodiment, the first signal path segment has a first peaking gain, and the second signal path segment has a second peaking gain that is higher than the first peaking gain.

In an embodiment, the first signal path segment has zero peaking gain, and the second signal path segment has a maximum peaking gain.

In an embodiment, the first signal path segment has a first transfer function, and the second signal path segment has a second transfer function that is different from the first transfer function.

In an embodiment, a universal serial bus (USB) redriver includes the equalizer.

In an embodiment, the reference voltage is zero volt.

In an embodiment, the equalizer is a Continuous Time Linear Equalizer (CTLE).

In an embodiment, the first signal path segment further includes a first capacitor connected between the first transistor and the reference voltage and a second capacitor connected between the second transistor and the reference voltage.

In an embodiment, the second plurality of serially connected transistors and current sources includes a third current source and a fourth current source connectable to the reference voltage, and a third transistor and a fourth transistor connected between the first and second transistors and the third and fourth current sources, where the second signal path segment further includes at least one resistor and at least one capacitor connected in parallel between the third and fourth current sources.

In an embodiment, at least one of the third and fourth transistors includes a BJT or a MOSFET.

In an embodiment, the equalizer further includes a third plurality of transistors connectable between the at least one termination resistor and the first, second, third, and fourth transistors.

In an embodiment, the at least one termination resistor includes termination resistors connected between the first and second signal path segments and connectable to a supply voltage, and the equalizer further includes at least one inductor connectable to the supply voltage or an output terminal of the equalizer.

In an embodiment, the supply voltage includes a direct current (DC) voltage.

In an embodiment, an equalizer includes a first signal path segment that comprises a first plurality of serially connected transistors and current sources, a second signal path segment that comprises a second plurality of serially connected transistors and current sources, and termination resistors connected to the first and second signal path segments and connectable to a supply voltage. The first signal path segment has a first transfer function, the second signal path segment has a second transfer function that is different from the first transfer function, the first signal path segment has a first peaking gain, and the second signal path segment has a second peaking gain that is higher than the first peaking gain.

In an embodiment, the first signal path segment has zero peaking gain, and the second signal path segment has a maximum peaking gain.

In an embodiment, the first plurality of serially connected transistors and current sources includes a first current source and a second current source connectable to a reference voltage and a first transistor and a second transistor connected between a plurality of input terminals of the equalizer and the first and second current sources, and the first signal path segment further includes at least one resistor connected between the first and second current sources.

In an embodiment, the first signal path segment further includes a first capacitor connected between the first transistor and the reference voltage and a second capacitor connected between the second transistor and the reference voltage.

In an embodiment, the second plurality of serially connected transistors and current sources includes a third current source and a fourth current source connectable to the reference voltage; and a third transistor and a fourth transistor connected between the first and second transistors and the third and fourth current sources, where the second signal path segment further includes at least one resistor and at least one capacitor connected in parallel between the third and fourth current sources.

In an embodiment, an equalizer includes a first signal path segment that comprises a first plurality of serially connected transistors and current sources, a second signal path segment that comprises a second plurality of serially connected transistors and current sources, termination resistors connected to the first and second signal path segments and connectable to a direct current (DC) supply voltage, at least one inductor connectable to the DC supply voltage or an output terminal of the equalizer, and a third plurality of transistors connectable between the termination resistors and the first and second signal path segments. The first signal path segment has a first transfer function, the second signal path segment has a second transfer function that is different from the first transfer function, the first signal path segment has a first peaking gain, and the second signal path segment has a second peaking gain that is higher than the first peaking gain.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
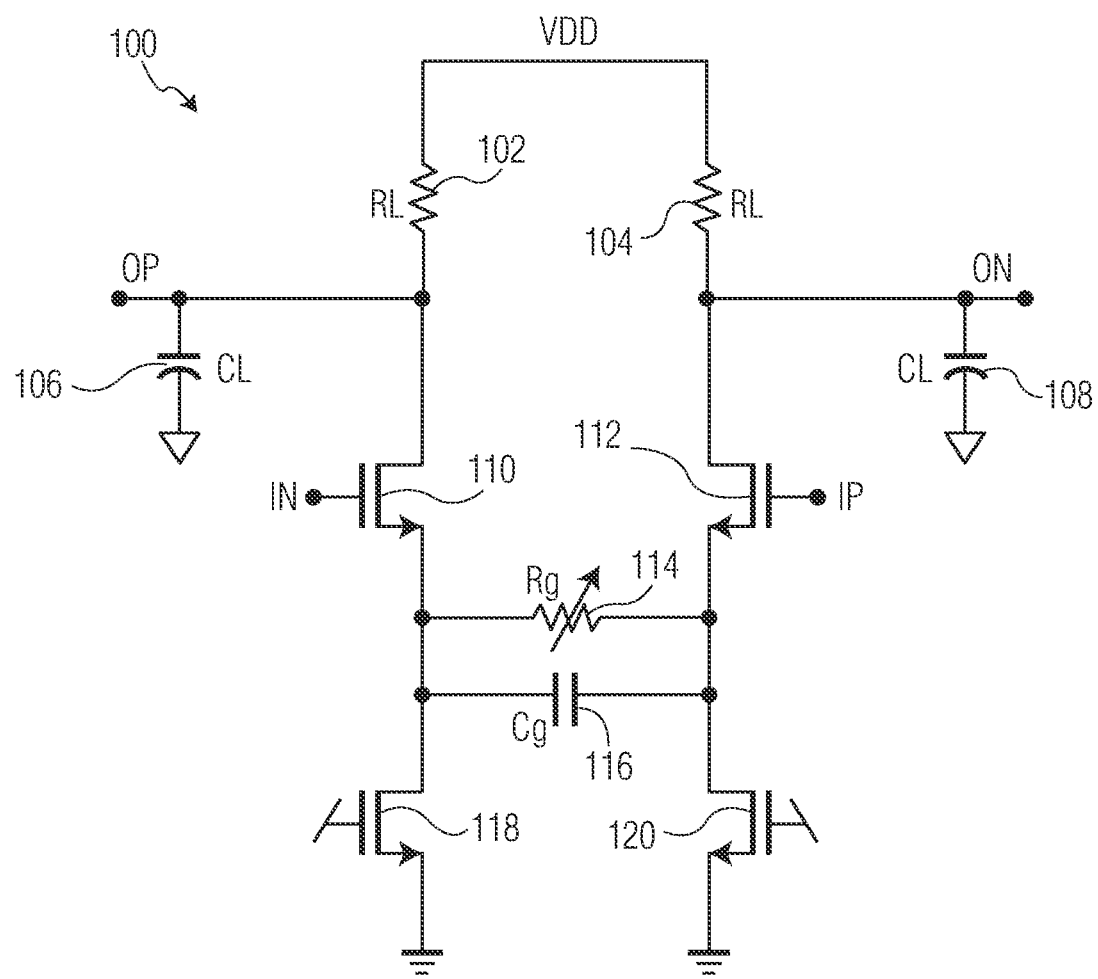
FIG. 1 depicts a conventional CTLE.

FIG. 1 depicts a conventional CTLE 100, which includes input ports IN, IP, output ports OP, ON, two resistors 102, 104, two capacitors 106, 108, two transistors 110, 112, a variable resistor 114, a capacitor 116, and two transistors 118, 120. The output port OP is coupled to the capacitor 106 with a capacitance CL that is coupled to ground and the resistor 102 with a resistance RL that is connected to a supply voltage $V_{DD}$. Similarly, the output port ON is coupled to the capacitor 108 with a capacitance CL that is coupled to ground and the resistor 104 with a resistance RL that is connected to the supply voltage $V_{DD}$. The input port IN is coupled with the gate of the transistor 110 and the input port IP is coupled with the gate of the transistor 112. The transistors 110, 112 are coupled together via the variable resistor 114 with a resistance Rg and the capacitor 116 with a capacitance Cg. The variable resistor 114 and the capacitor 116 are coupled with each other in parallel and to the ground through the two transistors 118, 120.

An equalizer realizes a transfer function, which can be tuned such that it is inverse of the channel transfer function. If properly tuned, the equalizer improves the receiver performance parameters, such as bit error rate (BER) and jitter tolerance. A conventional capacitive source-degenerated first-order CTLE, as shown in FIG. 1, with one zero and two poles, may provide limited capability to control the shape of CTLE transfer function. Poles and Zeros of a transfer function are the frequencies for which the value of the denominator and numerator of transfer function becomes zero respectively. The values of the poles and the zeros of a system determine whether the system is stable, and how well the system performs. In the conventional CTLE 100, the DC gain and the transfer function can be defined as:

$$A_{dc}=R_1/(R_g/2+1/g_m) \quad (1)$$

$$H(s) \approx A_{dc}(1+sR_gC_g)/((1+2sC_g/g_m)(1+s\,R_LC_L)) \quad (2)$$

where $A_{dc}$ is the DC gain of the CTLE 100, H(s) is the transfer function of the CTLE 100, $g_m$ is the transconductance of the differential pair transistors 110, 112. As it is seen from Equation (1), $R_g$ adjustment can change the DC gain and the zero location. It can be difficult to get high peaking gain and equal gain steps from the conventional architecture. For example, the maximum gain $A_{pk}$ of the conventional CTLE 100 can be defined as:

$$A_{pk}=g_m*RL \quad (3)$$

Although the conventional CTLE 100 is shown in FIG. 1 as being implemented as a CMOS based circuit, the conventional CTLE 100 may also be implemented using a BJT based circuit. For the conventional CTLE 100, the tuning can be done by changing a source degeneration resistor for a CMOS circuit or an emitter degeneration resistor for a BJT circuit. The DC attenuation can be changed while the peaking gain is fixed (Peaking gain=$g_m \cdot R_L$). In addition, when a degeneration resistor is changed, the DC attenuation/gain changes such that different equalizer gain of the CTLE can be obtained, which is defined as the difference between peaking gain over the DC gain. To keep the peak frequency fixed, Rg and Cg are tuned/adjusted to obtain different equalizer gain and to maintain the same peaking frequency. For high-speed applications, the tuning method of the conventional CTLE 100 can cause problems. For example, due to parasitic components of the conventional CTLE 100, using discrete tuning steps means that there should be different resistor and capacitor settings for each step. However, in an actual implementation of the conventional CTLE 100, the switches of these steps can introduce parasitic resistance and capacitance. These parasitic resistance and capacitance may not be well controlled and may cause unexpected peaking at low frequency or reduce the expected tuning range because the parasitic resistance and capacitance need to be calculated into the total amount of resistance and capacitance such that the actual tuning range can be reduced. Using varactors as a tuning capacitor may introduce less parasitic to the conventional CTLE 100. However, the varactor based tuning may not be predictable because the exact value of a varactor is unknown. Adding another tuning/trimming for a varactor can be expensive and add more parasitic components. Cascading two conventional CTLEs may result in the variation of the peaking gain over PVT that is twice of the variation of the peaking gain of a single stage CTLE.

Figure 2:
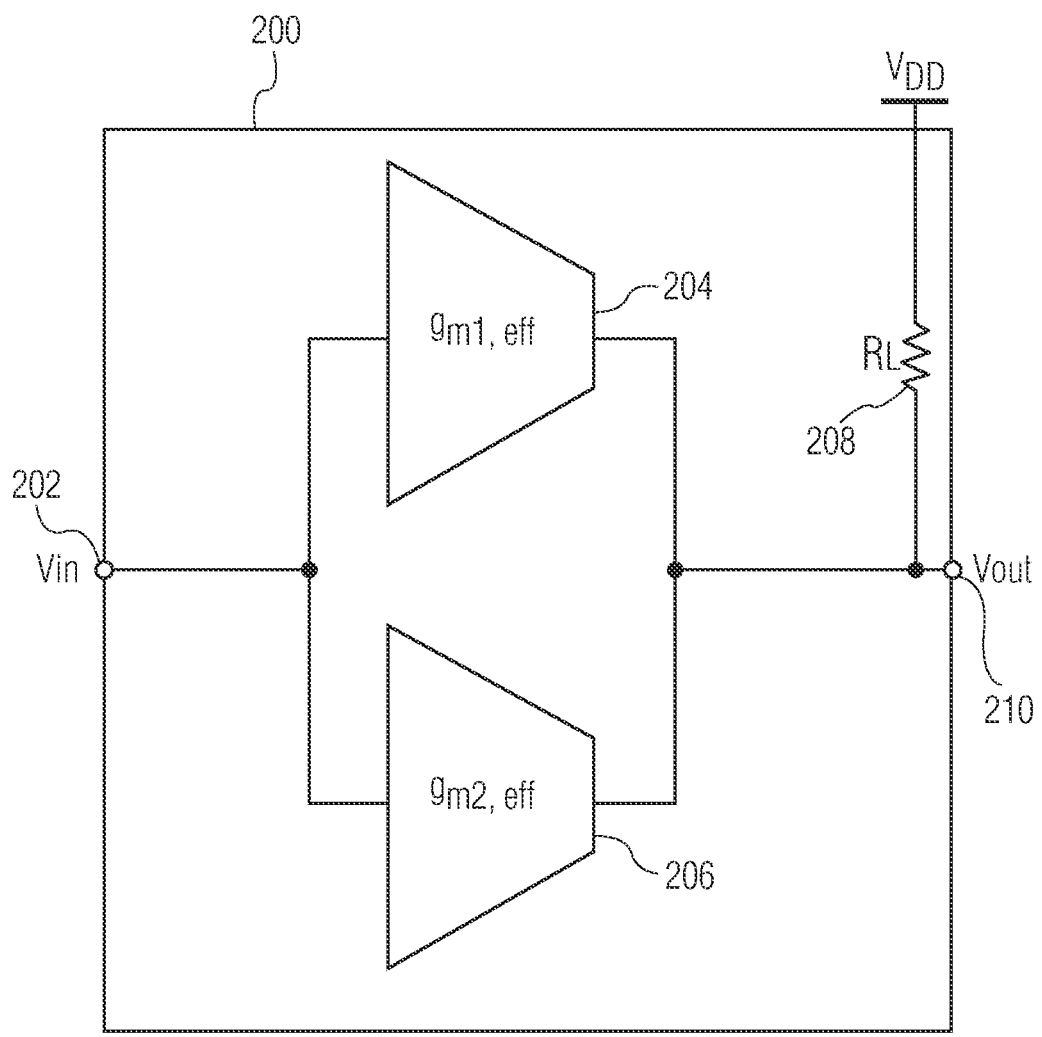
FIG. 2 depicts a CTLE in accordance with an embodiment of the invention.

FIG. 2 depicts a Continuous Time Linear Equalizer (CTLE) 200 in accordance with an embodiment of the invention. The CTLE 200 can be deployed at a receiver (RX) front end to compensate the channel loss and to provide an equalized low-jitter output data. The CTLE 200 may be incorporated in a wired communication device or a wireless communication device. In the embodiment depicted in FIG. 2, the CTLE 200 generates a desired output signal having an output voltage $V_{out}$ from an output terminal/pin 210 in response to an input signal having an input voltage $V_{in}$ received at an input terminal/pin 202. The CTLE 200 can be used in various applications, such as automotive applications, communications applications, industrial applications, medical applications, computer applications, and/or consumer or appliance applications. For example, the CTLE 200 can be used in USB, TBT, DP, and/or CIO applications. In some embodiments, the CTLE 200 is included in a USB device (e.g., a USB redriver that can be used to provide signal amplification and/or waveform shaping such that a transmitted signal behaves as intended over long channels). The CTLE 200 can be used for low supply applications and high-linearity applications, for examples, in linear redrivers or Peripheral Component Interconnect Express (PCIe) applications. In some embodiments, the CTLE 200 or at least a component of the CTLE 200 is implemented in a substrate and is packaged as a stand-alone semiconductor Integrated Circuit (IC) device or chip. In the embodiment depicted in FIG. 2, the CTLE 200 is a two-dimensional CTLE that includes two parallel signal path segments 204, 206, which have different effective transfer functions. Specifically, the CTLE 200 includes a DC path segment 204 with a transconductance of $g_{m1,eff}$ and a high-frequency path segment 206 with a transconductance of $g_{m2,eff}$. Because the CTLE 200 utilizes the high-frequency path segment 206, the CTLE 200 can be used for high-frequency applications. Each of the DC path segment 204 and the high-frequency path segment 206 may be implemented using serially connected transistors and current sources. In some embodiments, the DC path segment 204 has no or low peaking gain, which is referred as "flat band," and sets the low frequency gain for the CTLE 200, while the high-frequency path segment 206 has a higher peaking gain (e.g., a maximum peaking gain). The pole/zero (degeneration impedance) of each of the DC path segment 204 and the high-frequency path segment 206 can be adjusted separately for a desire CTLE gain curve for the CTLE 200. The DC path segment 204 may exhibit low pass feature with the bandwidth slightly greater than the Nyquist frequency of the data signal. In some embodiments, the high-frequency path segment 206 provides the gain peaking for the CTLE 200. Through a weighted summation of the two signal path segments 204, 206, the peaking gain of the CTLE 200 is programmable from 0 dB, or flat band gain to a maximum peaking gain available from the high-frequency path segment 206 (e.g., 20 dB). The CTLE 200 also includes at least one termination resistor 208 with a resistance $R_L$, which can be connectable to or terminated to a supply voltage $V_{DD}$ of the CTLE 200. However, depending on the design, the termination resistor 208 can be terminated to ground or other direct current (DC) voltage. In some embodiments, the input terminal/pin 202 and the output terminal/pin 210 of the CTLE 200 are connectable to decoupling capacitors or other electrical elements/loads. Although the CTLE 200 is shown in FIG. 2 as including the termination resistor 208, in other embodiments, the CTLE 200 includes a combination of resistor and/or capacitor as load and/or an inductor in series/parallel or as replacement for the termination resistor 208 to provide an impedance.

Considering a scheme where $g_{m1}+g_{m2}=G_m$, which is a constant value, the transconductance $g_{m1,eff}$ of the DC path segment 204 and the transconductance $g_{m2,eff}$ of the high-frequency path segment 206 can be expressed as:

$$g_{m1,eff} = \frac{g_{m1}}{1 + (g_{m1} + g_{m2})z_{E1}} \quad (4)$$

$$g_{m2,eff} = \frac{g_{m1}}{1 + (g_{m1} + g_{m2})z_{E2}} \quad (5)$$

where $Z_{E1}$ and $Z_{E2}$ represent source/emitter degeneration impedance values of the DC path segment 204 and the high-frequency path segment 206, respectively. The ratio between the output voltage $V_{out}$ and the input voltage $V_{in}$ of the CTLE 200 can be expressed as:

$$\frac{v_{out}}{v_{in}} = (g_{m1,eff} + g_{m2,eff})R_L \quad (6)$$

The ratio between the output voltage $V_{out}$ and the input voltage $V_{in}$ of the CTLE 200 can be further expressed as:

$$\frac{v_{out}}{v_{in}} = \frac{g_{m1}R_L}{1 + (g_{m1} + g_{m2})z_{E1}} + \frac{g_{m2}R_L}{1 + (g_{m1} + g_{m2})z_{E2}} \quad (7)$$

In some embodiments, for a fixed and maximum CTLE peaking gain for the CTLE 200, $g_{m1,eff}$ stays at its minimum value and $g_{m2,eff}$ stays at its maximum value. Compared with a two-dimensional CTLE that uses a single stage with two cores with a "dummy path" or a gain stage to keep total transconductance constant, the CTLE 200 has the DC path segment 204 and the high-frequency path segment 206 and avoids the dummy path or gain stage, which significantly reduces the current and power consumption in the CTLE 200.

Figure 3:
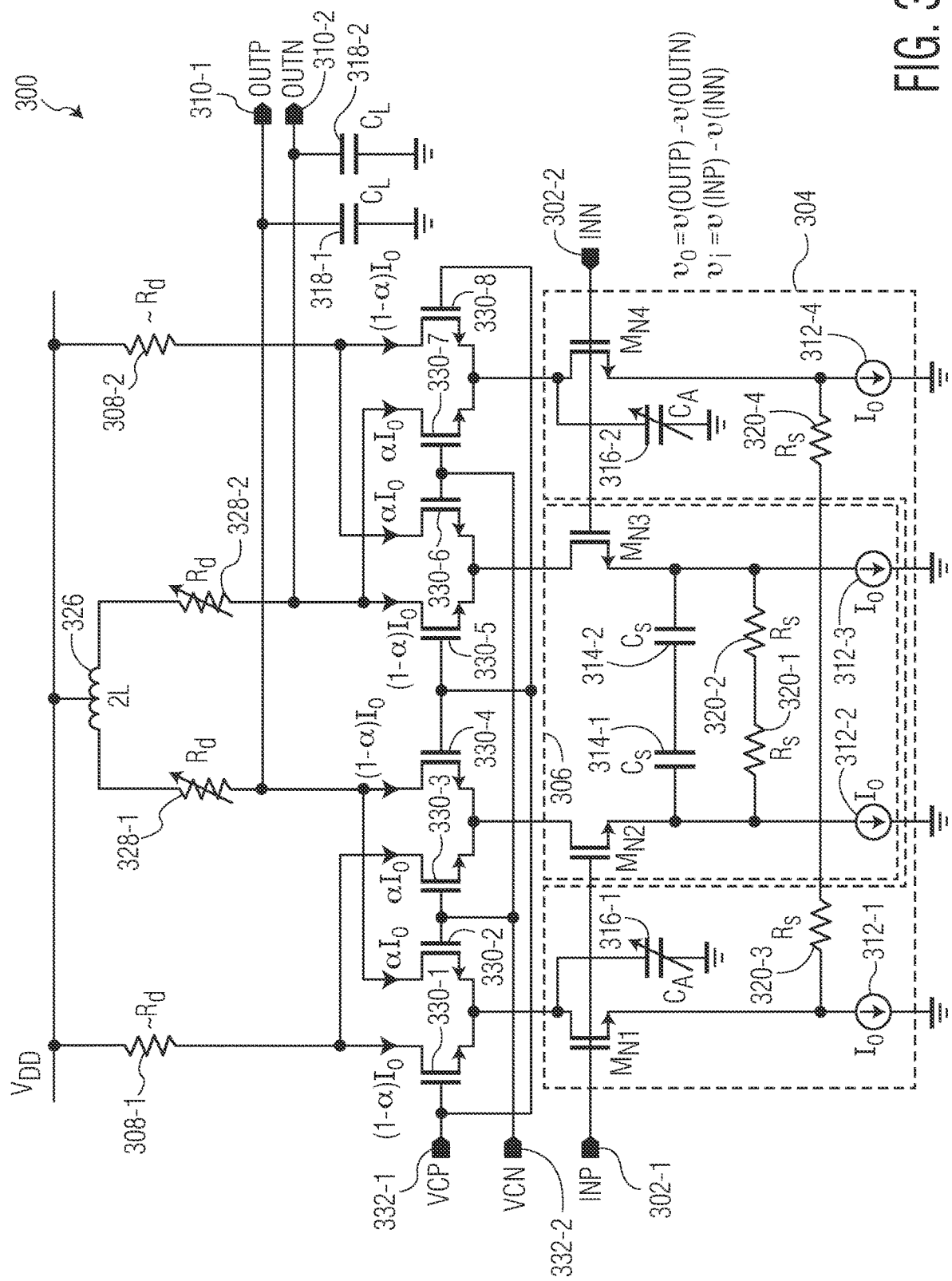
FIG. 3 is a schematic diagram of a two-dimensional CTLE in accordance with an embodiment of the invention.

FIG. 3 is a schematic diagram of a two-dimensional CTLE 300 in accordance with an embodiment of the invention. The CTLE 300 depicted in FIG. 3 is an embodiment of the CTLE 200 depicted in FIG. 2. However, the CTLE 200 depicted in FIG. 3 is not limited to the embodiment shown in FIG. 3. In the embodiment depicted in FIG. 3, the CTLE 200 generates desired output signals OUTP, OUTN from output terminals/pins 310-1, 310-2 in response to input signals INP, INN received at input terminals/pins 302-1, 302-2. As shown in FIG. 3, the CTLE 300 includes four current sources 312-1, 312-2, 312-3, 312-4 connectable to a reference voltage (e.g., the ground (zero volt)) and configured to provide a current $I_0$, four transistors $M_{N1}$, $M_{N2}$, $M_{N3}$, $M_{N4}$, six capacitors 314-1, 314-2, 316-1, 316-2, 318-1, 318-2, eight resistors 308-1, 308-2, 328-1, 328-2, 320-1, 320-2, 320-3, 320-4, an inductor 326, and eight additional transistors 330-1, 330-2, 330-3, 330-4, 330-5, 330-6, 330-7, 330-8. In some embodiments, the CTLE 300 is included in a USB device (e.g., a USB redriver that can be used to provide signal amplification and/or waveform shaping such that a transmitted signal behaves as intended over long channels). Although the CTLE 300 is shown in FIG. 3 as including certain circuit elements, in other embodiments, the CTLE 300 may include more or less circuit elements. For example, the resistors 320-1, 320-2 may be replaced with a single resistor and/or the resistors 320-3, 320-4 may be replaced with a single resistor. In another example, the capacitors 314-1, 314-2 may be replaced with a single capacitor.

In the CTLE 300 depicted in FIG. 3, the resistors 308-1, 308-2 with a resistance value R D and the inductor 326 with an inductance value 2L are connectable to a supply voltage $V_{DD}$. The resistors 328-1, 328-2 may be variable resistors with a resistance value that is the same as or close to $R_D$ and are connected to the output terminals/pins 310-1, 310-2 and to the transistors 330-4, 330-5. The capacitors 318-1, 318-2 have a capacitance value C L and are connected to the output terminals/pins 310-1, 310-2. The resistors 320-1, 320-2, 320-3, 320-4 have a resistance value $R_S$ and are connected between the transistors $M_{N1}$, $M_{N2}$, $M_{N3}$, $M_{N4}$. The capacitors 314-1, 314-2 have a capacitance value C s and are connected to the transistors $M_{N2}$, $M_{N3}$, while the capacitors 316-1, 316-2 are variable capacitors with a capacitance value $C_A$ and are connected to the transistors $M_{N1}$, $M_{N4}$. Although the CTLE 300 (e.g., the transistors $M_{N1}$, $M_{N2}$, $M_{N3}$, $M_{N4}$ and the transistors 330-1, 330-2, 330-3, 330-4, 330-5, 330-6, 330-7, 330-8) is depicted in FIG. 3 as implemented using metal-oxide-semiconductor field-effect transistor (MOSFETs), in other embodiments, the CTLE 300 is implemented using bipolar junction transistors (BJTs). The CTLE 300 depicted in FIG. 3 may be a modified Gilbert cell. In the embodiment depicted in FIG. 3, the degeneration resistors 320-3, 320-4 are located across the split current sources 312-1, 312-4 to form a DC path segment 304, which also includes the transistors $M_{N1}$, $M_{N4}$ and the capacitors 316-1, 316-2 with the capacitance $C_A$. The capacitors 316-1, 316-2 are attenuation capacitors used in the DC path segment 304 to attenuate the unnecessary peaking of the DC path segment 304 due to the parasitic current source capacitance. The degeneration resistors 320-1, 320-2 and the capacitors 314-1, 314-2 are located across the split current sources 312-2, 312-3 to form a high-frequency path segment 306, which also include the transistors $M_{N2}$, $M_{N3}$. Because the CTLE 300 utilizes the high-frequency path segment 306, the CTLE 300 can be used for high-frequency applications. The DC path segment 304 and the high-frequency path segment 306 have different effective transfer functions. The pole/zero (degeneration impedance) of each of the DC path segment 304 and the high-frequency path segment 306 can be adjusted separately for a desire CTLE gain curve for the CTLE 300. The DC path segment 304 and the high-frequency path segment 306 provide a fixed flat gain and a programmable equalizer gain for the CTLE 300 in response to control voltages $V_{CP}$, $V_{CN}$ received at terminals/pins 332-1, 332-2. In the CTLE 300 depicted in FIG. 3, flat gain and high-frequency gain can be controlled or adjusted by adjusting the resistances $R_d$, $R_S$ of the resistors 308-1, 308-2, 328-1, 328-2, 320-1, 320-2, 320-3, 320-4 and/or the capacitances $C_A$, $C_S$ of the capacitors 316-1, 316-2, 314-1, 314-2. In complementary metal-oxide-semiconductor (CMOS) technology, parasitic capacitance of a tail current may be overly large to generate a flat response for the DC path segment 304. In Bipolar CMOS (BiCMOS) technology, switching transistors can be replaced with bipolar transistors. High-frequency bipolar usually have lower break down voltage that may not operate well in higher power supply voltage, which is necessary for high linearity. In some embodiments, the current sources 312-1, 312-2, 312-3, 312-4 are implemented with high-breakdown-voltage N-channel metal-oxide-semiconductor (NMOS) devices (e.g., thick oxide (GO2) NMOS devices) to handle high voltage drop during power off. Compared with a two-dimensional CTLE that uses a single stage with two cores with a "dummy path" or a gain stage to keep total transconductance constant, the CTLE 300 has the DC path segment 304 and the high-frequency path segment 306 and avoids the dummy path or gain stage, which can significantly reduce the current and power consumption in the CTLE 300. Using half of the needed input transistors of a two-dimensional CTLE that uses a single stage with two cores with a "dummy path" or a gain stage, the CTLE 300 can provide similar performance (e.g., peaking and DC gain) with less generated noise. The CTLE 300 can be used in high-frequency applications that need high peaking gains.

In some embodiments, the CTLE 300 performs a weighted addition of two signal path segments 304, 306, one of which has zero or low peaking gain and the other provides the maximum peaking gain. The peaking gain can be selectable by adjusting the weights of the two signal path segments via controlling injected bias current that defines transconductance (gm) of transistors MN1, MN2, MN3, MN4. In the CTLE 300 depicted in FIG. 3, DC or flat gain (FG) at low frequency can be controlled by controlling or setting the ratio between $R_d$ and $R_S$ if amplifier transconductance $g_m$ of the transistors MN1, MN2, MN3, MN4 is large enough. Trimming/reducing the resistance $R_S$ of the resistors 320-1, 320-2, 320-3, 320-4 can introduce extra uncontrolled peaking due to the increased parasitic at source side. Trimming/reducing the resistance $R_d$ of the resistors 308-1, 308-2, 328-1, 328-2 can lower the bandwidth due to increased parasitic at load. The total transfer function of the CTLE 300 can be written as:

$$\frac{v_o}{v_i} = (1-\alpha) \cdot \frac{g_m R_d}{1+g_m R_s} + \alpha \cdot \frac{g_m((R_d+sL)\|\frac{1}{sC_L})}{1+g_m(R_s\|\frac{1}{sC_s})} \quad (8)$$

where vo=v(OUTP)−v(OUTN) and vi=v(INP)−v(INN). To simplify the analysis, ignoring the inductor 326 (e.g., a T-coil), which is used for bandwidth extension. Equation (8) become:

$$\frac{v_o}{v_i} = (1-\alpha) \cdot \frac{g_m R_d}{1+g_m R_s} + \alpha \cdot \frac{g_m(R_d \| \frac{1}{sC_L})}{1+g_m(R_s \| \frac{1}{sC_s})}$$

By separating the flat gain and peaking gain, the flat gain $G_F$ from the DC path segment 304 can be expressed as:

$$G_F = \frac{g_m R_D}{1+g_m R_s} \sim \frac{R_D}{R_s} \quad (9)$$

The peaking gain $G_P$ from the high-frequency path segment 306 can be expressed as:

$$G_P = \alpha \cdot g_m R_D$$

The equalization gain of the CTLE 300 can be expressed as:

$$\frac{G_P}{G_F} = \alpha(1+g_m R_s) \quad (11)$$

Figure 4:
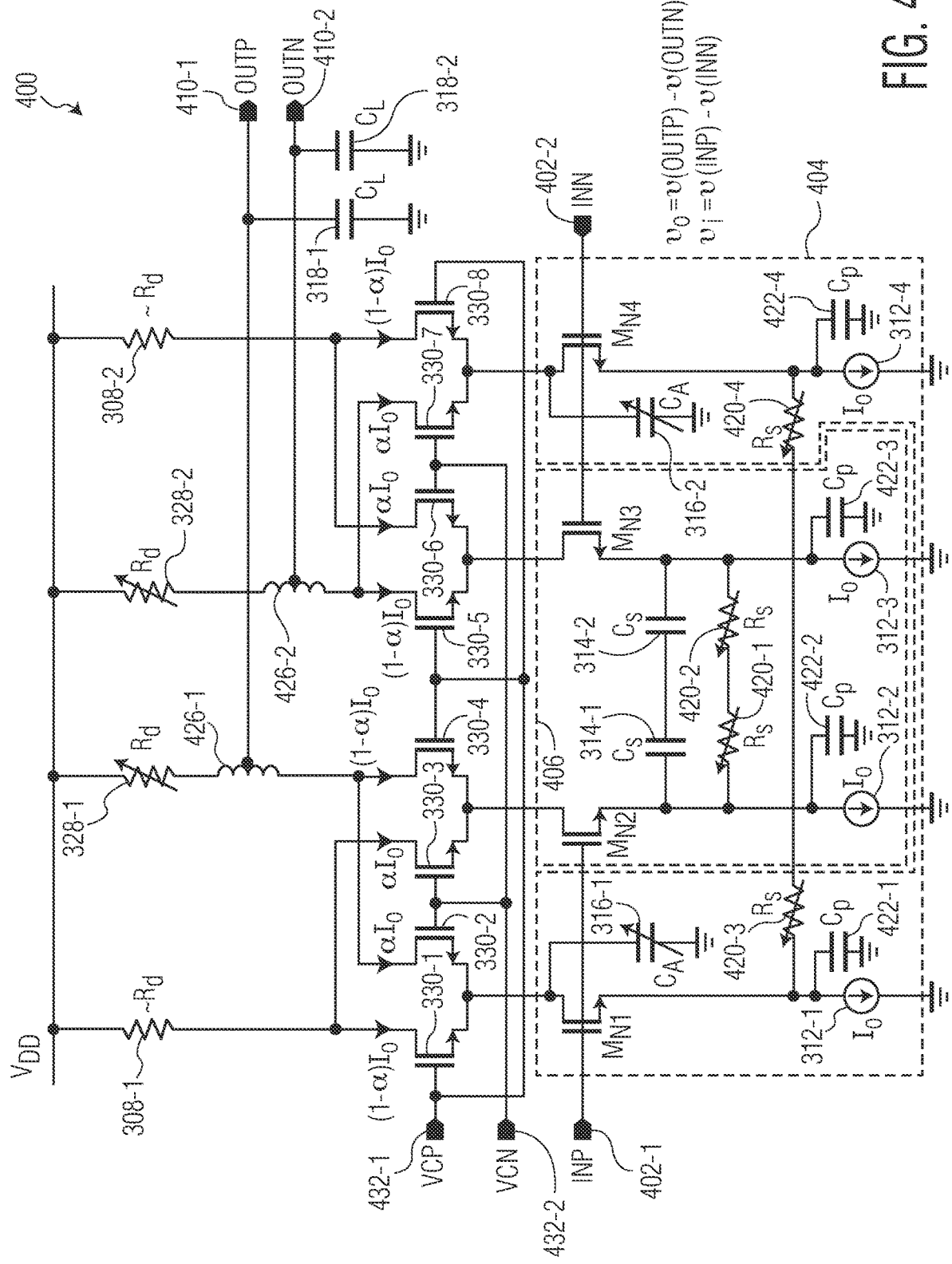
FIG. 4 is a schematic diagram of a two-dimensional CTLE with inductors for bandwidth extension in accordance with an embodiment of the invention.

In some embodiments, the inductor 326 is replaced with two shunt peaking coils for bandwidth extension. FIG. 4 is a schematic diagram of a two-dimensional CTLE 400 with two shunt peaking coils 426-1, 426-2 for bandwidth extension in accordance with an embodiment of the invention. With the shunt peaking coils 426-1, 426-2, the capacitance in the two-dimensional CTLE 400 can be reduced or canceled. The CTLE 400 depicted in FIG. 4 is an embodiment of the CTLE 200 depicted in FIG. 2. However, the CTLE 200 depicted in FIG. 2 is not limited to the embodiment shown in FIG. 4. In the embodiment depicted in FIG. 4, the CTLE 400 generates desired output signals OUTP, OUTN from output terminals/pins 410-1, 410-2 in response to input signals INP, INN received at input terminals/pins 402-1, 402-2. As shown in FIG. 4, the CTLE 400 includes four current sources 312-1, 312-2, 312-3, 312-4 connectable to a reference voltage (e.g., the ground (zero volt)) and configured to provide a current $I_0$ with capacitors 422-1, 422-2, 422-3, 422-4 connectable to the reference voltage, four transistors $M_{N1}$, $M_{N2}$, $M_{N3}$, $M_{N4}$, six capacitors 314-1, 314-2, 316-1, 316-2, 318-1, 318-2, eight resistors 308-1, 308-2, 328-1, 328-2, 420-1, 420-2, 420-3, 420-4, the shunt peaking coils 426-1, 426-2, and eight transistors 330-1, 330-2, 330-3, 330-4, 330-5, 330-6, 330-7, 330-8. In some embodiments, the CTLE 400 is included in a USB device (e.g., a USB redriver that can be used to provide signal amplification and/or waveform shaping such that a transmitted signal behaves as intended over long channels). Although the CTLE 400 is shown in FIG. 4 as including certain circuit elements, in other embodiments, the CTLE 400 may include more or less circuit elements. For example, the resistors 420-1, 420-2 may be replaced with a single resistor and/or the resistors 420-3, 420-4 may be replaced with a single resistor. In another example, the capacitors 314-1, 314-2 may be replaced with a single capacitor.

In the CTLE 400 depicted in FIG. 4, the resistors 308-1, 308-2 with the resistance value $R_d$ and the resistors 328-1, 328-2, which are variable resistors with the resistance value $R_d$, are connectable to the supply voltage $V_{DD}$. The shunt peaking coils 426-1, 426-2 with an inductance value L are connected to the output terminals/pins 410-1, 410-2 and to the transistors 330-4, 330-5. The capacitors 318-1, 318-2 have the capacitance value $C_L$ and are connected to the output terminals/pins 410-1, 410-2. The resistors 420-1, 420-2, 420-3, 420-4 are variable resistors with a variable resistance value $R_S$ and are connected between the transistors $M_{N1}$, $M_{N2}$, $M_{N3}$, $M_{N4}$. The capacitors 314-1, 314-2 have the capacitance value $C_s$ and are connected to the transistors $M_{N2}$, $M_{N3}$, while the capacitors 316-1, 316-2 are variable capacitors with the capacitance value $C_A$ and are connected to the transistors $M_{N1}$, $M_{N4}$. Although the CTLE 400 (e.g., the transistors $M_{N1}$, $M_{N2}$, $M_{N3}$, $M_{N4}$ and the transistors 330-1, 330-2, 330-3, 330-4, 330-5, 330-6, 330-7, 330-8) is depicted in FIG. 4 as implemented using MOSFETs, in other embodiments, the CTLE 400 is implemented using BJTs. In the embodiment depicted in FIG. 4, the degeneration resistors 420-3, 420-4 are located across the split current sources 412-1, 412-4 to form a DC path segment 404, which also includes the transistors $M_{N1}$, $M_{N4}$ and the capacitors 316-1, 316-2. The capacitors 316-1, 316-2 are attenuation capacitors used in the DC path segment 404 to attenuate the unnecessary peaking of the DC path segment 404 due to the parasitic current source capacitance. The degeneration resistors 420-1, 420-2 and the capacitors 314-1, 314-2 are located across the split current sources 312-2, 312-3 to form a high-frequency path segment 406, which also include the transistors $M_{N2}$, $M_{N3}$. Because the CTLE 400 utilizes the high-frequency path segment 406, the CTLE 400 can be used for high-frequency applications. The pole/zero (degeneration impedance) of each of the DC path segment 404 and the high-frequency path segment 406 can be adjusted separately for a desire CTLE gain curve for the CTLE 400. The DC path segment 404 and the high-frequency path segment 406 provide a fixed flat gain and a programmable peaking with respected to control voltages $V_{CP}$, $V_{CN}$ received at terminals/pins 432-1, 432-2. In the CTLE 400, flat gain and high-frequency gain trimming can be controlled or adjusted by adjusting the resistances $R_d$, $R_S$ of the resistors 308-1, 308-2, 328-1, 328-2, 420-1, 420-2, 420-3, 420-4 and the capacitances $C_A$, $C_S$ of the capacitors 316-1, 316-2, 314-1, 314-2. In some embodiments, the CTLE 400 performs a weighted addition of two signal path segments 404, 406, one of which has zero or low peaking gain and the other provides the maximum peaking gain. The peaking gain can be selectable by adjusting the weights of the two signal path segments via controlling injected bias current that defines transconductance (gm) of transistors MN1, MN2, MN3, MN4. In CMOS technology, parasitic capacitance of the tail current may be overly large to generate a flat response for the DC path segment 404. In BiCMOS technology, switching transistors are replaced with bipolar transistors. In some embodiments, current sources are implemented with high-breakdown-voltage NMOS transistors to handle the high voltage drop during power off (e.g., GO2 NMOS devices). Compared with a two-dimensional CTLE that uses a single stage with two cores with a "dummy path" or a gain stage to keep total transconductance constant, the CTLE 400 has the DC path segment 404 and the high-frequency path segment 406 and avoids the dummy path or gain stage, which can significantly reduce the current and power consumption in the CTLE 400. Using half of the needed input transistors of a two-dimensional CTLE that uses a single stage with two cores with a "dummy path" or a gain stage, the CTLE 400 can provide similar performance (e.g., peaking and DC gain) with less generated noise. The CTLE 400 can be used in high-frequency applications that need high peaking gains.

Although some embodiments of CTLEs are described and shown as being implemented by metal-oxide-semiconductor field-effect transistor (MOSFETs), in other embodiments, a CTLE can be implemented by bipolar transistors.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, electrically erasable programmable read-only memory (EEPROM), a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An equalizer comprising:
   a first signal path segment that comprises a first plurality of serially connected transistors and current sources;
   a second signal path segment that comprises a second plurality of serially connected transistors and current sources; and
   at least one termination resistor connected to the first and second signal path segments,
   wherein the first plurality of serially connected transistors and current sources comprises:
   a first current source and a second current source connectable to a reference voltage; and
   a first transistor and a second transistor connected between a plurality of input terminals of the equalizer and the first and second current sources,
   wherein the first signal path segment further comprises at least one resistor connected between the first and second current sources.

2. The equalizer of claim 1, wherein at least one of the first and second signal path segments comprises a bipolar junction transistor (BJT) or a metal-oxide-semiconductor field-effect transistor (MOSFET).

3. The equalizer of claim 1, wherein the first signal path segment has a first peaking gain, and wherein the second signal path segment has a second peaking gain that is higher than the first peaking gain.

4. The equalizer of claim 1, wherein the first signal path segment has zero peaking gain, and wherein the second signal path segment has a maximum peaking gain.

5. The equalizer of claim 1, wherein the first signal path segment has a first transfer function, and wherein the second signal path segment has a second transfer function that is different from the first transfer function.

6. A universal serial bus (USB) redriver, wherein the USB redriver comprises the equalizer of claim 1.

7. The equalizer of claim 1, wherein the reference voltage is zero volt.

8. The equalizer of claim 1, wherein the equalizer is a Continuous Time Linear Equalizer (CTLE).

9. The equalizer of claim 1, wherein the first signal path segment further comprises:
   a first capacitor connected between the first transistor and the reference voltage; and
   a second capacitor connected between the second transistor and the reference voltage.

10. The equalizer of claim 1, wherein the second plurality of serially connected transistors and current sources comprises:
    a third current source and a fourth current source connectable to the reference voltage; and
    a third transistor and a fourth transistor connected between the first and second transistors and the third and fourth current sources,
    wherein the second signal path segment further comprises at least one resistor and at least one capacitor connected in parallel between the third and fourth current sources.

11. The equalizer of claim 10, wherein at least one of the third and fourth transistors comprises a bipolar junction transistor (BJT) or a metal-oxide-semiconductor field-effect transistor (MOSFET).

12. The equalizer of claim 10, further comprising a third plurality of transistors connectable between the at least one termination resistor and the first, second, third, and fourth transistors.

13. The equalizer of claim 1, wherein the at least one termination resistor comprises a plurality of termination resistors connected between the first and second signal path segments and connectable to a supply voltage, and wherein the equalizer further comprises at least one inductor connectable to the supply voltage or an output terminal of the equalizer.

14. The equalizer of claim 13, wherein the supply voltage comprises a direct current (DC) voltage.

15. An equalizer comprising:
    a first signal path segment that comprises a first plurality of serially connected transistors and current sources;
    a second signal path segment that comprises a second plurality of serially connected transistors and current sources; and
    a plurality of termination resistors connected to the first and second signal path segments and connectable to a supply voltage, wherein the first signal path segment has a first transfer function, wherein the second signal path segment has a second transfer function that is different from the first transfer function, wherein the first signal path segment has a first peaking gain, and wherein the second signal path segment has a second peaking gain that is higher than the first peaking gain.

16. The equalizer of claim 15, wherein the first signal path segment has zero peaking gain, and wherein the second signal path segment has a maximum peaking gain.

17. The equalizer of claim 16, wherein the first plurality of serially connected transistors and current sources comprises:
a first current source and a second current source connectable to a reference voltage; and
a first transistor and a second transistor connected between a plurality of input terminals of the equalizer and the first and second current sources,
wherein the first signal path segment further comprises at least one resistor connected between the first and second current sources.

18. The equalizer of claim 17, wherein the first signal path segment further comprises:
a first capacitor connected between the first transistor and the reference voltage; and
a second capacitor connected between the second transistor and the reference voltage.

19. The equalizer of claim 17, wherein the second plurality of serially connected transistors and current sources comprises:
a third current source and a fourth current source connectable to the reference voltage; and
a third transistor and a fourth transistor connected between the first and second transistors and the third and fourth current sources,
wherein the second signal path segment further comprises at least one resistor and at least one capacitor connected in parallel between the third and fourth current sources.

20. An equalizer comprising:
a first signal path segment that comprises a first plurality of serially connected transistors and current sources;
a second signal path segment that comprises a second plurality of serially connected transistors and current sources;
a plurality of termination resistors connected to the first and second signal path segments and connectable to a direct current (DC) supply voltage;
at least one inductor connectable to the DC supply voltage or an output terminal of the equalizer; and
a third plurality of transistors connectable between the termination resistors and the first and second signal path segments,
wherein the first signal path segment has a first transfer function, wherein the second signal path segment has a second transfer function that is different from the first transfer function, wherein the first signal path segment has a first peaking gain, and wherein the second signal path segment has a second peaking gain that is higher than the first peaking gain.

* * * * *